(12) United States Patent
Dossi

(10) Patent No.: US 7,348,660 B2
(45) Date of Patent: Mar. 25, 2008

(54) SEMICONDUCTOR PACKAGE BASED ON LEAD-ON-CHIP ARCHITECTURE, THE FABRICATION THEREOF AND A LEADFRAME FOR IMPLEMENTING IN A SEMICONDUCTOR PACKAGE

(75) Inventor: Roberto Dossi, Dresden (DE)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 135 days.

(21) Appl. No.: 11/192,981

(22) Filed: Jul. 29, 2005

(65) Prior Publication Data
US 2007/0023871 A1   Feb. 1, 2007

(51) Int. Cl.
*H01L 23/495* (2006.01)

(52) U.S. Cl. .................... 257/676; 257/677

(58) Field of Classification Search ......... 257/666–676
See application file for complete search history.

(56) References Cited

U.S. PATENT DOCUMENTS

| | | | | |
|---|---|---|---|---|
| 4,989,068 | A | * | 1/1991 | Yasuhara et al. ........... 257/788 |
| 6,433,421 | B2 | | 8/2002 | Masuda et al. |
| 6,714,418 | B2 | * | 3/2004 | Frankowsky et al. ....... 361/735 |
| 2003/0107121 | A1 | * | 6/2003 | Roohparvar ................ 257/691 |
| 2004/0164422 | A1 | | 8/2004 | Lee |
| 2004/0212053 | A1 | | 10/2004 | Koh et al. |

FOREIGN PATENT DOCUMENTS

EP    0 329 317 A2    8/1989

OTHER PUBLICATIONS

ESPI Kovar Datasheet (http://www.espimetals.com/tech/kovar.pdf).*

* cited by examiner

*Primary Examiner*—Jerome Jackson
*Assistant Examiner*—Jami M Valentine
(74) *Attorney, Agent, or Firm*—Slater & Matsil, L.L.P.

(57) ABSTRACT

A leadframe includes a multiplicity of leads. The leads have a board level contact portion, an intermediate portion and a chip level contact portion. The intermediate portion is disposed between the board level contact portion and the chip level contact portion. The board level contact portions extend from one of the first side or the second side of the semiconductor device along a second direction. The chip level contact portions extend along the first direction. Ends of the chip level contact portions are aligned along a line extending along the second direction. This leadframe can be included with a semiconductor chip in a packaged integrated circuit.

16 Claims, 5 Drawing Sheets

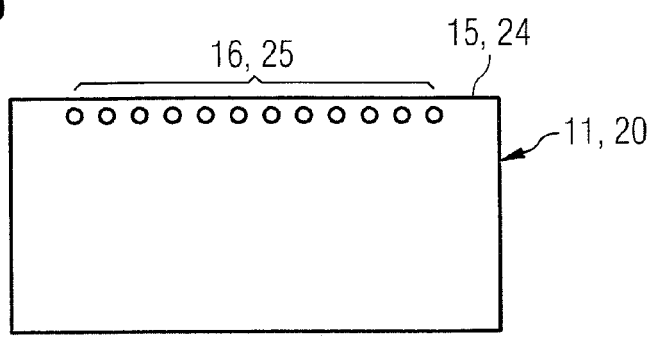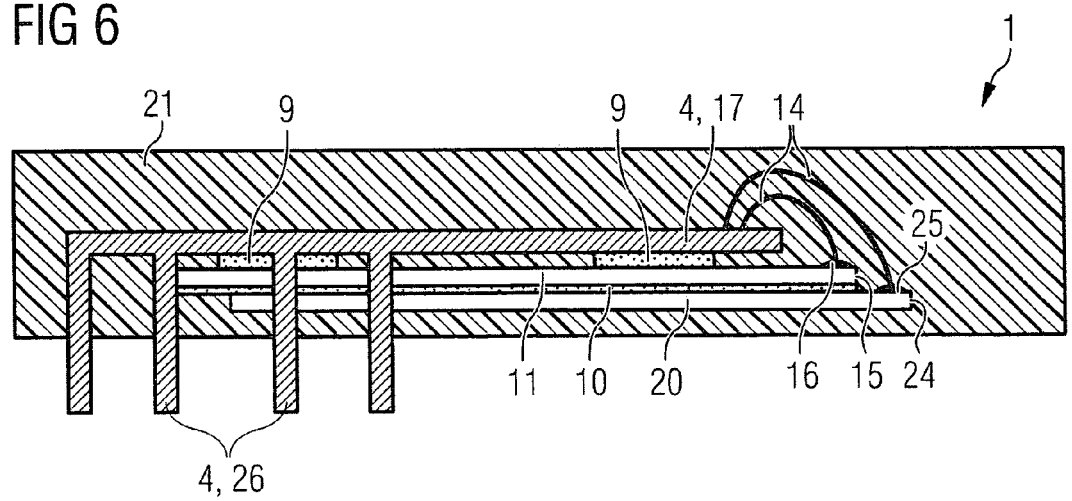

SEMICONDUCTOR PACKAGE BASED ON LEAD-ON-CHIP ARCHITECTURE, THE FABRICATION THEREOF AND A LEADFRAME FOR IMPLEMENTING IN A SEMICONDUCTOR PACKAGE

TECHNICAL FIELD

The present invention relates generally to semiconductor devices and more particularly to semiconductor packages based on lead-on-chip architecture.

BACKGROUND

Several leadframe packages having an industry standard pin layout and specified length and width are commonly used to house DRAM devices. The packages comprise a leadframe having a plurality of leads that serve as support for the semiconductor chip. Bonding wires connect the bonding pads of the chip to interconnecting leads of the leadframe that protrude on opposing sides from the molding compound and allow data transfer of the chip with an external device. The wire bonds are typically thin gold wires having a significant inductance. Therefore, layouts are preferred in which the distance between the leadframe terminals and the bonding pads of the chip is minimized.

Typically the bonding wires are located close to the interconnecting leads on opposing sides of the package. Therefore, the length of the side of the chip extending orthogonally to the opposing sides of the package where the interconnecting leads are located is limited. Since the chip size determines the data storage capability of the chip, the data storage capability is also limited. U.S. Patent Publication No. 2004/0212053 A1, which is incorporated herein by reference, discloses an arrangement, wherein the bond pads of the chip are located on a centerline on a surface of the chip. The centerline bond pads are re-distributed by a re-distribution layer on the surface of the chip. The ending locations of the fan-out pads of the redistribution layer are chosen to match with the leadframe terminal.

What is desired is a semiconductor device based on lead-on-chip architecture and a method for fabricating thereof, in which the arrangement of the bond pads of a chip and the corresponding terminal leads of a leadframe allows fitting in bigger chips into the semiconductor device, wherein the process for fabricating the semiconductor chip is a fast and low-cost process.

SUMMARY OF THE INVENTION

Embodiments of the invention provide for a semiconductor device based on a lead-on-chip architecture and a method for fabricating thereof, in which the arrangement of the bond pads of a chip and the corresponding terminal leads of a leadframe allows fitting in bigger chips into the semiconductor device. The process for fabricating the semiconductor chip is a fast and low-cost process.

One embodiment of the present invention provides a method for fabricating a semiconductor device. The method comprises the steps of providing a chip, wherein the chip has an edge and contacts disposed on a surface of the chip in vicinity to the edge. Providing a leadframe, wherein the leadframe comprises a multiplicity of leads, wherein the leads have a board level contact portion, an intermediate portion and a chip level contact portion. The intermediate portion is disposed between the board level contact portion and the chip level contact portion and connects the board level contact portion and the chip level contact portion. The leadframe further comprises a first side extending along a first direction and a second side extending along the first direction. The board level contact portions extend from one of the first side and the second side of the leadframe along a second direction. The chip level contact portions extend along the first direction and ends of the chip level contact portions are aligned along a line extending along the second direction. The method further comprises placing surfaces of the multiplicity of leads onto a portion of the surface of the chip such that the contacts of the chip are disposed in vicinity to the ends of the chip level contact portions of the multiplicity of leads. The method further comprises coupling the contacts of the chip to the chip level contact portions of the multiplicity of leads, molding the chip and the leadframe, thereby forming a molded package, and removing portions of the leadframe such that the board level contact portions of the multiplicity of leads protrude from the molded package.

In another embodiment of the present invention, the step of providing a leadframe includes providing the leadframe having a third side extending along the second direction and a fourth side extending along the second direction, wherein the first and the second side are shorter than the third and the fourth side.

In another embodiment of the present invention, the step of providing the leadframe includes providing the leadframe having a multiplicity of leads, wherein the multiplicity of leads includes leads having the board level contact portion disposed in vicinity to the third side of the leadframe.

In another embodiment of the present invention, the step of providing a leadframe includes providing a leadframe that comprises copper.

In another embodiment, the step of providing a leadframe includes providing a leadframe that comprises iron, nickel, manganese and copper.

In another embodiment of the invention, the step of placing surfaces of the multiplicity of leads onto the portion of the surface of the chip includes the steps of providing a tape, placing the tape onto the surfaces of the multiplicity of leads and placing the surfaces of the multiplicity of leads onto the portion of the surface of the chip.

In another embodiment, the step of coupling the contacts of the chip to the chip level contact portions of the multiplicity of leads includes bonding a wire between the contacts of the chip and the chip level contact portions of the multiplicity of leads.

In another embodiment, the step of providing the leadframe includes the steps of providing a sheet metal, stamping the sheet metal to form the chip level contact portions, the intermediate portions and the board level contact portions of the leads of the multiplicity of leads.

In another embodiment, the step of providing the leadframe includes the steps of providing a sheet metal, etching the sheet metal to form the chip level contact portions, the intermediate portions and the board level contact portions of the leads of the multiplicity of leads.

In another embodiment, the method further comprises the steps of providing another chip having an edge and having contacts, the contacts being disposed on a surface of the other chip in vicinity to the edge, placing a portion of the surface of the other chip onto another surface of the chip such that the contacts of the other chip are disposed in vicinity to the ends of the chip level contact portions of the multiplicity of leads and coupling the contacts of the other chip to the chip level contact portions of the multiplicity of leads.

In another embodiment, the step of placing the other chip onto the chip includes the steps of providing another tape, placing the other tape onto the other surface of the chip and placing the portion of the surface of the other chip onto the other tape.

Another aspect of the present invention provides a semiconductor device, wherein the semiconductor device has a first side extending along a first direction and a second side extending along the first direction. The semiconductor device further comprises a chip having an edge and having contacts disposed on a surface of the chip in vicinity to the edge, a leadframe comprising a multiplicity of leads, the leads having a board level contact portion, an intermediate portion and a chip level contact portion, wherein the intermediate portion is disposed between the board level contact portion and the chip level contact portion and connects the board level contact portion and the chip level contact portion. The board level contact portions extend from one of the first side and the second side of the semiconductor device along a second direction. The chip level contact portions extend along the first direction. Ends of the chip level contact portions are aligned along a line extending along the second direction. Surfaces of the multiplicity of leads are disposed on portions of the surface of the chip, wherein the contacts of the chip are disposed in vicinity to the ends of the chip level contact portions of the multiplicity of leads. The contacts of the chip are coupled to the chip level contact portions of the multiplicity of leads. The chip and the leadframe are molded and form a molded package and the board level contact portions of the multiplicity of leads protrude from the molded package.

In another embodiment, the semiconductor device comprises a third side extending along the second direction and a fourth side extending along the second direction, wherein the first and the second side of the semiconductor device are shorter than the third and the fourth side of the semiconductor device.

In another embodiment, the multiplicity of leads includes leads having the board level contact portion disposed in vicinity to the third side of the semiconductor.

In another embodiment, the leadframe comprises copper.

In another embodiment, the leadframe comprises iron, nickel, manganese and copper.

In another embodiment, a tape is disposed between the surfaces of the multiplicity of leads and the portions of the surface of the chip.

In another embodiment, the contacts of the chip are coupled to the chip level contact portions of the multiplicity of leads by bonding wires.

In another embodiment, the semiconductor device further comprises another chip having an edge and having contacts disposed on a surface of the other chip in vicinity to the edge, wherein a portion of the surface of the other chip is disposed on another surface of the chip, and the contacts of the other chip are coupled to the chip level contact portions of the multiplicity of leads.

In another embodiment, another tape is disposed between the other surface of the chip and the surface of the other chip.

Another aspect of the present invention provides a leadframe for implementing in a semiconductor device. The leadframe comprises a multiplicity of leads, the leads having a board level contact portions, an intermediate portion and a chip level contact portion, wherein the intermediate portion is disposed between the board level contact portion and the chip level contact portion. The leadframe has a first side extending along a first direction and a second side extending along the first direction. The board level contact portions extend from one of the first side and the second side of the leadframe along a second direction. The chip level contact portions extend along the first direction. Ends of the chip level contact portion are aligned along a line extending along the second direction.

In another embodiment, the leadframe has a third side extending along the second direction and a fourth side extending along the second direction, wherein the first and the second sides are shorter than the third and the fourth sides.

In another embodiment, the multiplicity of leads includes leads having the board level contact portion disposed in vicinity to the third side of the leadframe.

In another embodiment, the leadframe comprises copper.

In another embodiment, the leadframe comprises iron, nickel, manganese and copper.

DESCRIPTION OF THE DRAWINGS

For a more complete understanding of the present invention, and the advantages thereof, reference is now made to the following descriptions taken in conjunction with the accompanying drawing, in which:

FIG. 5 shows a plan view of a top surface of a chip according to one embodiment of the invention; and FIG. 6 depicts schematically a cross-sectional view of a semiconductor device according to one embodiment of the invention.

The following list of reference symbols can be used in conjunction with the figures:

| | |
|---|---|
| 1 | semiconductor device |
| 2 | leadframe |
| 4 | lead |
| 5 | first side of leadframe |
| 6 | third side of leadframe |
| 7 | second side of leadframe |
| 8 | fourth side of leadframe |
| 9 | tape |
| 10 | tape |
| 11 | chip |
| 12 | line extending along a second direction |
| 13 | intermediate portion of lead |
| 14 | wire |
| 15 | edge of chip |
| 16 | contacts of chip |
| 17 | chip level contact portion of lead |
| 18 | board level contact portion of lead |
| 19 | end of chip level contact portion of lead |
| 20 | other chip |
| 21 | molded package |
| 22 | leads having the board level contact portion disposed near the third side of the leadframe |
| 23 | leads having the board level contact portion disposed near the fourth side of the leadframe |
| 24 | edge of other chip |

-continued

| 25 | contacts of other chip |
| 26 | portion of lead |
| 27 | first side of semiconductor device |
| 28 | third side of semiconductor device |
| 29 | second side of semiconductor device |
| 30 | fourth side of semiconductor device |
| 31 | leads having two or more chip level contact portions connected to one intermediate portion |
| 32 | leads having terminations not aligned along line 12 |
| 33 | leads extending from the first side of the leadframe in vicinity to the fourth side of the leadframe |
| 34 | leads extending from the second side of the leadframe in vicinity to the fourth side of the leadframe |

DETAILED DESCRIPTION OF ILLUSTRATIVE EMBODIMENTS

Figure 1:
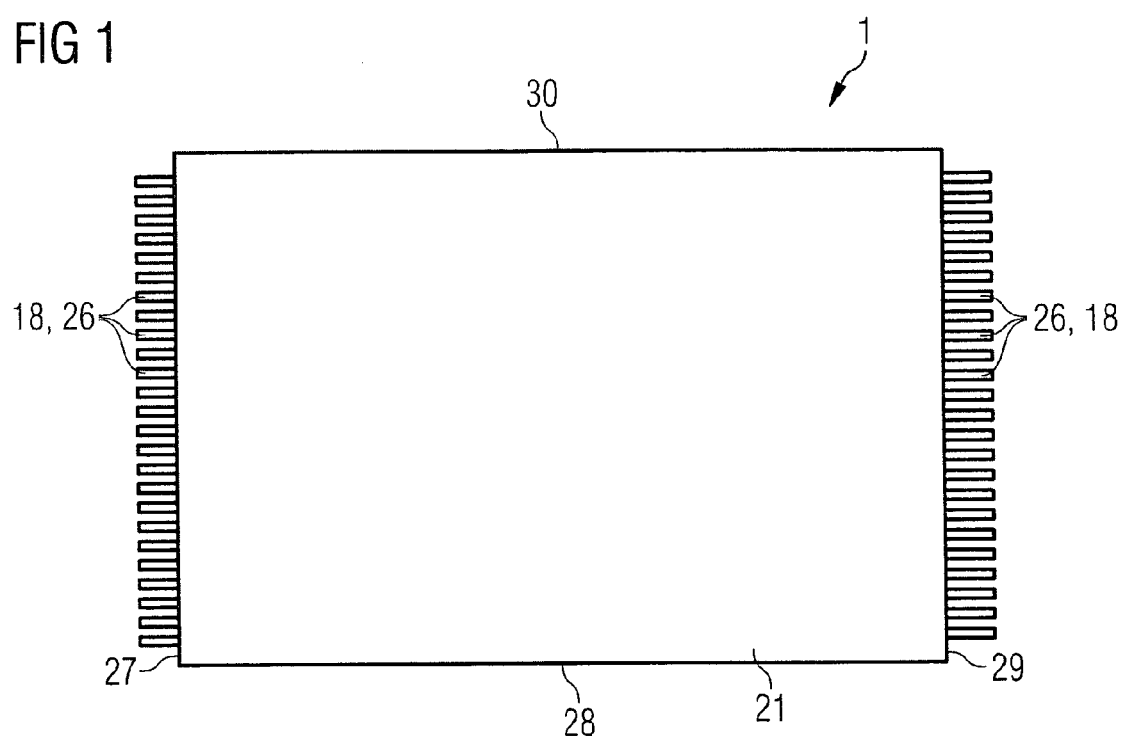
FIG. 1 depicts a plan view of a semiconductor device according to one embodiment of the present invention.

FIG. 1 depicts a plan view of a semiconductor device 1 according to one embodiment of the present invention. The semiconductor device 1 has a first side 27, a second side 29, a third side 28 and a fourth side 30. The first side 27 and the second side 29 are shorter than the third side 28 and the fourth side 30. The first side 27, the second side 29, the third side 28 and the fourth side 30 of the semiconductor form a rectangle.

The semiconductor device 1 comprises a molded package 21. The surface of the molded package 21 is made of epoxy resulting from the injection molding at a stage of the fabrication process of the semiconductor device 1. A portion of a leadframe 2 (e.g., depicted in FIG. 2) is encapsulated by the molded package 21. Portions 26 of board level contact portions 18 of the leadframe 2 protrude from the first side 27 and from the second side 29 of the semiconductor device 1. The portions 26 of the board level contact portions 18 may be coated with a layer that facilitates soldering, preferably tin or an alloy comprising tin.

Data transfer including data input and output between the semiconductor device 1 and an external device can be established through these portions 26 of the board level contact portions 18. The outer dimensions of the molded package 21 and the arrangement of the portions 26 of the board level contact portions 18 may comply with standardized TSOP packages or other common DRAM packages. The portions 26 of the board level contact portions 18 can be formed into a gull-wing shape or alternatively the portions 26 of the board level contact portions 18 can be wrapped around the bottom of the molded package 21.

Figure 2:
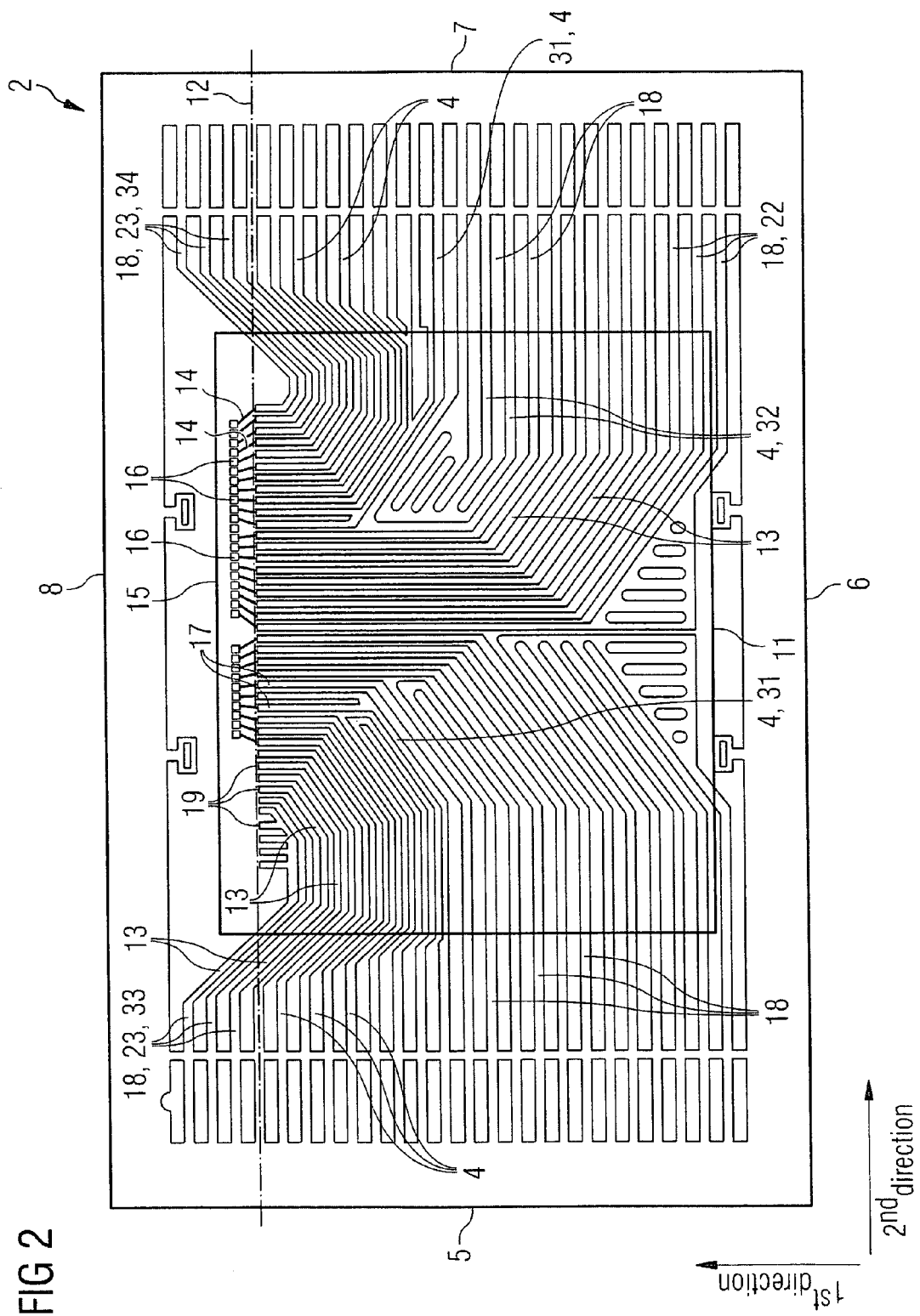
FIG. 2 depicts schematically a plan view of a semiconductor device according to one embodiment of the invention in a stage of the production process.

FIG. 2 depicts schematically a plan view of a semiconductor device according to one embodiment of the invention in a stage of the production process. A leadframe 2 acts as a substrate for the process of fabricating the semiconductor device 1.

The leadframe 2 may be fabricated from a metal sheet through a stamping process. Alternatively, the leadframe 2 can be fabricated through structuring the metal sheet by applying a laser beam, a water beam or by using a suited etchant. The leadframe 2 may be included in a carrier band that includes a multiplicity of leadframes 2.

The leadframe 2, that may comprise copper or preferably an alloy comprising 57.7% iron, 41% nickel, 0.8% manganese and 0.5% copper, has a first side 5, a second side 7, a third side 6 and a fourth side 8. The first side 5 and the second side 7 extend along a first direction and the third side 6 and the fourth side 8 extend along a second direction, wherein the second direction is different from the first direction. In this embodiment, the first side 5 and the second side 7 of the leadframe 2 are shorter than the third side 6 and the fourth side 8. The first side 5, the second side 7, the third side 6 and the fourth side 8 of the leadframe 2 may also have the same length, or the first side 5 and the second side 7 may be longer than the third side 6 and the fourth side 8.

The leadframe has a multiplicity of leads 4. The leads 4 comprise a board level contact portion 18, an intermediate portion 13 and a chip level contact portion 17. The board level contact portions 18 and the chip level contact portions 17 may be arranged in one plane. Alternatively, the board level contact portions 18 may be arranged in a first plane and the chip level contact portions 17 may be arranged in a second plane that is different from the first plane.

The board level contact portions 18 serve as interfaces between the semiconductor device 1 and an external device. The board level contact portions 18 of a subset of the multiplicity of leads 4 extend from one of the first side 5 and the second side 7 along the second direction, and the chip level contact portions 17 of the subset of the multiplicity of leads 4 extend along the first direction. The intermediate portions 13 of the subset of the multiplicity of leads 4 connect the board level contact portions 18 and the chip level contact portions 17 of the subset of the multiplicity of leads 4. The ends 19 of the chip level contact portions 17 of the subset of the multiplicity of leads 4 are aligned along a line 12 that extends along the second direction. The position of the line 12 is preferably shifted towards the fourth side 8 of the leadframe 2 as compared to the position of the third side 6 of the leadframe 2. In an alternative embodiment, some leads 4 may have ends 19 of the chip level contact portions 17 that are aligned along an other line extending along the second direction.

There are leads 4, 31 having two or more chip level contact portions 17 connected to one intermediate portion 13 of the leads 4. Additionally, there are some leads 4, 32 that have terminations that are not aligned along the line 12.

There are leads 4 having the board level contact portion 18, 22 disposed in vicinity to the third side 6 of the leadframe 2 and leads 4 having the board level contact portion 18, 23 disposed in vicinity to the fourth side 8 of the leadframe 2. The board level contact portions 18, 22 of leads 4 having the board level contact portions 18 disposed in vicinity to the third side 6 of the leadframe 2 are longer than the board level contact portions 18, 23 of leads 4 having the board level contact portions 18 disposed in vicinity to the fourth side 8 of the leadframe 2.

Furthermore, the chip level contact portions 17 of leads 4 having the board level contact portions 18, 22 disposed in vicinity to the third side 6 of the leadframe 2 are longer than the chip level contact portions 17 of leads 4 having the board level contact portions 18, 23 disposed in vicinity to the fourth side 8 of the leadframe 2.

The intermediate portions 13 of leads 4 that extend from the second side 7 of the leadframe 2 and that have the board level contact portions 18, 22 disposed in vicinity to the third side 6 of the leadframe 2, are oriented at a first preferred angle with regard to the first direction.

The intermediate portions 13 of leads 4 that extend from the second side 7 of the leadframe 2 and that have the board level contact portions 18, 23, 34 disposed in vicinity to the fourth side 8 of the leadframe 2, can be divided into three sub portions. A first sub portion coupled to the board level contact portion 18, 23, 34 is oriented at a second preferred angle with regard to the first direction. A second sub portion coupled to the first sub portion is oriented along the second direction and a third sub portion coupled to the second sub portion and to the chip level contact portion 17 is oriented at the first preferred angle with regard to the first direction.

The intermediate portions 13 of leads 4 that extend from the first side 5 of the leadframe 2 and that have the board level contact portions 18, 23, 33 disposed in vicinity to the fourth side 8 of the leadframe 2, can be divided into three sub portions. A first sub portion coupled to the board level contact portion 18, 23, 33 is oriented at a third preferred angle with regard to the second direction. A second sub portion coupled to the first sub portion is oriented along the second direction and a third sub portion coupled to the second sub portion and to the chip level contact portion 17 is oriented at a fourth preferred angle with regard to the second direction.

A chip 11 having contacts 16 disposed on the top surface in vicinity to an edge 15 of the chip 11 is disposed below the multiplicity of leads 4. The top surface of the chip 11 faces bottom surfaces of the multiplicity of leads 4. The edge 15 of the chip 11 extends along the second direction such that the contacts 16 of the chip are disposed in vicinity to the ends 19 of the chip level contact portions 17 of the subset of the multiplicity of leads 4. Preferably, the chip 11 is disposed below the leads 4 such that the edge 15 of the chip 11 and the contacts 16 of the chip 11 are located closer to the fourth side 8 of the leadframe 2 than the line 12.

The chip 11 may be mounted to the leadframe 2 by an adhesive tape 9 (not shown in FIG. 2) that is disposed between the top surface of the chip 11 and the bottom surfaces of the leads 4. Contacts 16 of the chip 11 are coupled to corresponding chip level contact portions 17 of the subset of the multiplicity of leads 4. The coupling is effected by wire bonds 14, that preferably comprise gold. The areas of the chip level contact portions 17 of the subset of the multiplicity of leads 4, to which the wires 14 are bonded, may be aligned along a line extending along the second direction.

The special arrangement of the contacts 16 of the chip 11 and the chip level contact portions 17 of the leads 4 allow to stretch the dimension of the chip 11 along the second direction as compared to an arrangement where the coupling between a chip and a leadframe is established in vicinity to the first 5 and the second 7 side of the leadframe.

Figure 3:
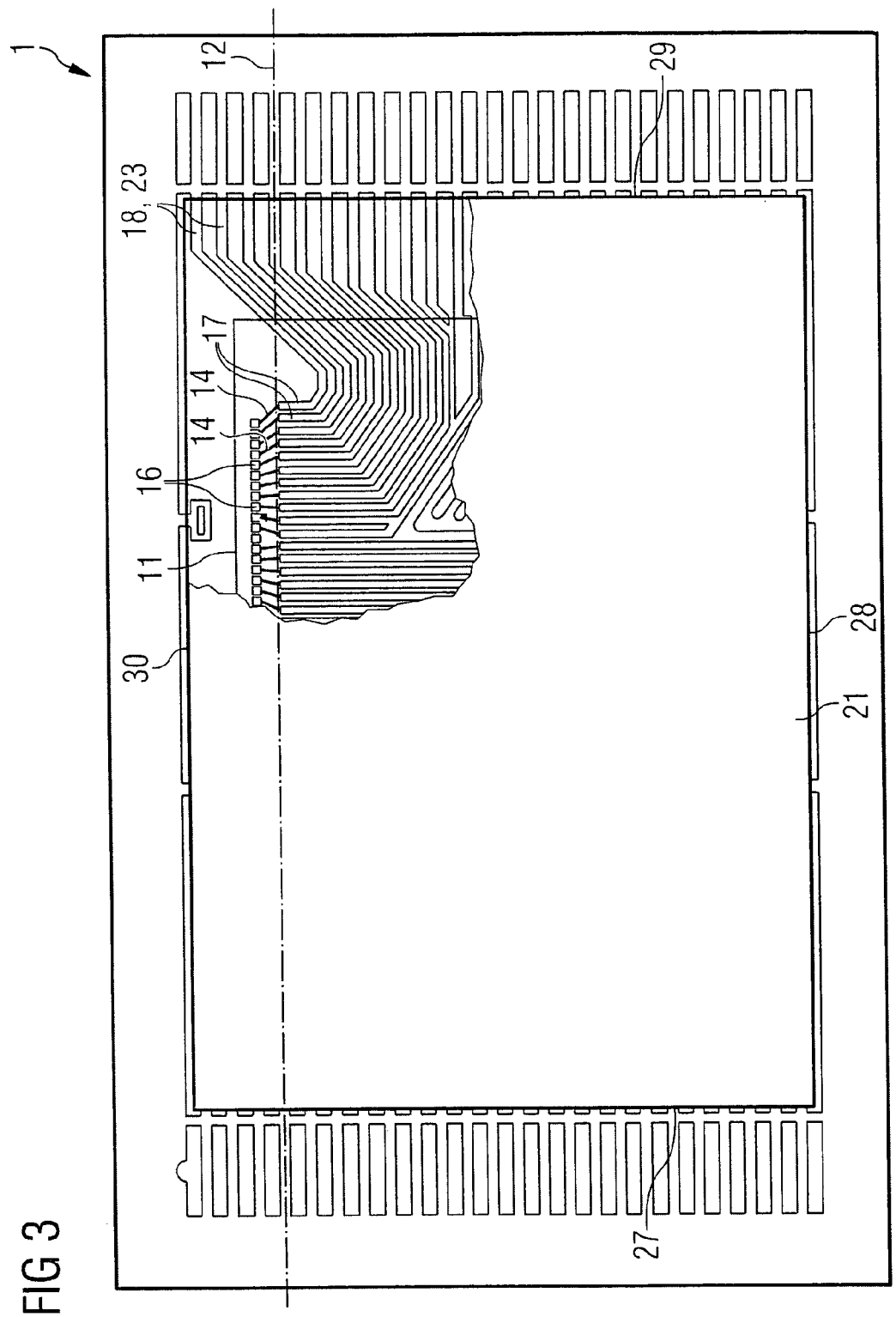
FIG. 3 depicts a plan view of a semiconductor device according to one embodiment of the invention in a stage of the production process.

FIG. 3 depicts a plan view of a semiconductor device 1 according to one embodiment in a stage of the production process. A portion of the leadframe 2 as depicted in FIG. 2 is molded with epoxy and forms a molded package 21. The edges of the molded package 21 are the first 27, second 29, third 28 and fourth 30 side of the semiconductor device 1.

Alternatively, other materials such as resin may be used to encapsulate the chip 11, the bonding wires 14, the tape 9 and portions of the leadframe 2. The encapsulation may be established by an injection molding process including placing the chip 11, the bonding wires 14, the tape 9 and portions of the leadframe 2 into a molding cavity that is preheated and designed to be impermeable for the molding material but permeable for air. The molding material, that is preheated up to a certain temperature at which the molding material is liquid and has a certain viscosity, is injected into the molding cavity. The molding material fills the space between the molding cavity and the chip 11, the bonding wires 14, the tape 9 and portions of the leadframe 2. The temperature of the molding cavity supports the flow of the molding material into corners and edges of the mold. After the molding material has become cold, the molded package 21 is removed from the molding cavity. Then a post-mold cure may be performed.

Figure 4:
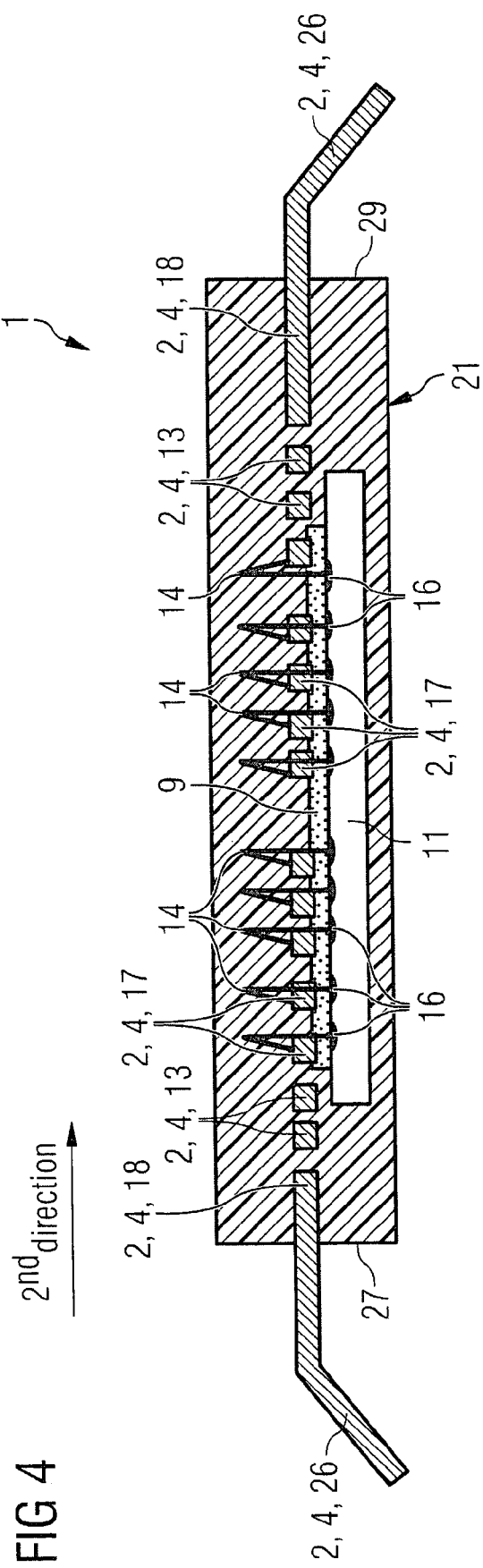
FIG. 4 depicts schematically a cross-sectional view of a semiconductor device according to one embodiment of the invention.

FIG. 4 depicts schematically a cross-sectional view of a semiconductor device 1 according to one embodiment of the invention. Bottom surfaces of a multiplicity of leads 4 of a leadframe 2 are disposed on a top surface of a chip 11. The chip 11 has contacts 16 disposed on the top surface. The leadframe 2 is mounted to the chip 11 through an adhesive tape 9. The contacts 16 of the chip 11 are connected to chip level contact portions 17 of leads 4 of the leadframe 2 through bonding wires 14. The chip level contact portions 17 extend along a first direction that is perpendicular to the depicted plane. The board level contact portions 18 extend along a second direction. The chip 11, the bonding wires 14, the tape 9 and portions of the leadframe 2 are encapsulated by epoxy and form a molded package 21. Portions 26 of the board level contact portions 18 of the leads 4 protrude from the molded package 21 on the first 27 and on the second 29 side of the semiconductor device 1. The portions 26 of the board level contact portions 18 of the leads 4 are bent.

FIG. 5 shows a plan view of a top surface of a chip 11, 20 according to one embodiment of the invention. Contacts 16, 25 are arranged on the top surface along a row in vicinity of an edge 15,24 of the chip 11, 20. The chip 11, 20 may be a memory chip having a capability for data storage. The contacts 16, 25 may allow data transfer between the chip 11, 20 and an external device.

FIG. 6 depicts schematically the cross-sectional view of a semiconductor device 1 according to one embodiment of the invention. Bottom surfaces of a multiplicity of leads 4 of a leadframe 2 are disposed on a top surface of a chip 11. The chip 11 has contacts 16 disposed on the top surface in vicinity to an edge 15 of the chip. Due to the cross-sectional view, only one contact 16 of the chip is depicted.

The chip 11 is arranged with respect to the leads 4 such that the portion of the top surface of the chip 11, where the contacts 16 are disposed, is not covered by leads 4. Bonding wires 14 connect the contacts 16 of the chip 11 to corresponding chip level contact portions 17 of leads 4. Between the bottom surfaces of the multiplicity of leads 4 and the top surface of the chip 11 an adhesive tape 9 is disposed to mount the leads 4 to the chip 11.

A top surface of another chip 20 is disposed on a bottom surface of the chip 11. An adhesive or tape 10, disposed between the top surface of the other chip 20 and the bottom surface of the chip 11, mounts the other chip 20 to the chip 11. The other chip 20 has contacts 25 disposed on the top surface in vicinity to an edge 24 of the other chip 20. The portion of the top surface of the other chip 20, where the contacts 25 are disposed, is not covered by the chip 11 or the leads 4. Bonding wires 14 connect the contacts 25 of the other chip 20 with corresponding chip level contact portions 17 of leads 4. The chip 11, the other chip 20, the bonding wires 14 and portions of the leads 4 are encapsulated by epoxy and form a molded package 21.

It is to be understood, that this invention is not limited to the particular component parts of the devices described or to process steps of the methods described as such devices and methods may vary. It is also to be understood, that different features as described in different embodiments, for example illustrated with different figures, may be combined to new embodiments. It is finally to be understood, that the terminology used herein is for the purposes of describing particular embodiments only and it is not intended to be limiting. It must be noted, that as used in the specification and the appended claims, the singular forms of "a", "an", and "the" include plural referents until the context clearly dictates otherwise.

What is claimed is:

1. A semiconductor device, said semiconductor device having a first side extending along a first direction, a second side extending along said first direction, a third side extending along a second direction, and a fourth side extending along said second direction, wherein said first and said second sides are shorter than said third and said fourth sides; said semiconductor device comprising:
   a chip having an edge and having contacts disposed on a top surface of said chip in vicinity to said edge;
   a leadframe comprising a multiplicity of leads, each lead having a board level contact portion, an intermediate portion, and a chip level contact portion, wherein said intermediate portion is disposed between said board level contact portion and said chip level contact portion;
   said board level contact portions extending from one of said first side or said second side of said semiconductor device along said second direction;
   said chip level contact portions extending along said first direction;
   ends of said chip level contact portions being aligned along a line extending along said second direction;
   surfaces of said multiplicity of leads being disposed on portions of said top surface of said chip, wherein said contacts of said chip are disposed in vicinity to said ends of said chip level contact portions of said multiplicity of leads, said contacts of said chip being coupled to said chip level contact portions of said multiplicity of leads;
   said chip and said leadframe being molded and forming a molded package; and
   said board level contact portions of said multiplicity of leads protruding from said molded package.

2. The semiconductor device according to claim 1, wherein said multiplicity of leads includes leads having said board level contact portion disposed in vicinity to said third side of said semiconductor device.

3. The semiconductor device according to claim 1, wherein said leadframe comprises copper.

4. The semiconductor device according to claim 3, wherein said leadframe comprises iron, nickel, manganese, and copper.

5. The semiconductor device according to claim 1, further comprising a tape disposed between said surfaces of said multiplicity of leads and said portions of said top surface of said chip.

6. The semiconductor device according to claim 1, wherein said contacts of said chip are coupled to said chip level contact portions of said multiplicity of leads by bonding wires.

7. The semiconductor device according to claim 1, further comprising a second chip having an edge and having contacts disposed on a top surface of said second chip in vicinity to said edge; wherein
   a portion of said top surface of said second chip is disposed on a bottom surface of said chip, and said contacts of said second chip are coupled to said chip level contact portions of said multiplicity of leads.

8. The semiconductor device according to claim 7, wherein an adhesive is disposed between said bottom surface of said chip and said top surface of said second chip.

9. A leadframe for implementing in a semiconductor device, said leadframe comprising:
   a multiplicity of leads, each lead having a board level contact portion, an intermediate portion and a chip level contact portion, wherein said intermediate portion is disposed between said board level contact portion and said chip level contact portion;
   a first side extending along a first direction;
   a second side extending along said first direction;
   a third side extending along a second direction;
   a fourth side extending along said second direction, wherein said first and said second sides are shorter than said third and said fourth sides;
   said board level contact portions extending from one of said first side or said second side of said leadframe along said second direction;
   said chip level contact portions extending along said first direction; and
   ends of said chip level contact portions being aligned along a line extending along said second direction.

10. The leadframe according to claim 9, wherein said multiplicity of leads includes leads having said board level contact portion disposed in vicinity to said third side of said leadframe.

11. The leadframe according to claim 9, wherein said leadframe comprises copper.

12. The leadframe according to claim 11, wherein said leadframe comprises iron, nickel, manganese, and copper.

13. A semiconductor device, said semiconductor device having a first side extending along a first direction, a second side extending along said first direction, a third side extending along a second direction, and a fourth side extending along said second direction; said semiconductor device comprising:
   a chip having an edge and having contacts disposed on a top surface of said chip in vicinity to said edge;
   a leadframe comprising a multiplicity of leads, each lead having a board level contact portion, an intermediate portion, and a chip level contact portion, wherein said intermediate portion is disposed between said board level contact portion and said chip level contact portion;
   said board level contact portions extending from one of said first side or said second side of said semiconductor device along said second direction;
   said chip level contact portions extending along said first direction;
   ends of said chip level contact portions being aligned along a line extending along said second direction, wherein the chip level contact portions of the multiplicity of leads having the board level contact portions disposed in vicinity to the third side are longer than the chip level contact portions of the multiplicity of leads having the board level contact portions disposed in vicinity to the fourth side;
   surfaces of said multiplicity of leads being disposed on portions of said top surface of said chip, wherein said contacts of said chip are disposed in vicinity to said ends of said chip level contact portions of said multiplicity of leads, said contacts of said chip being coupled to said chip level contact portions of said multiplicity of leads;

said chip and said leadframe being molded and forming a molded package; and said board level contact portions of said multiplicity of leads protruding from said molded package.

14. The semiconductor device according to claim 13, wherein the line extending along said second direction is disposed closer to the fourth side than the third side.

15. A leadframe for implementing in a semiconductor device, said leadframe comprising:

a multiplicity of leads, each lead having a board level contact portion, an intermediate portion and a chip level contact portion, wherein said intermediate portion is disposed between said board level contact portion and said chip level contact portion;

a first side extending along a first direction;

a second side extending along said first direction;

a third side extending along a second direction;

a fourth side extending along said second direction;

said board level contact portions extending from one of said first side or said second side of said leadframe along said second direction;

said chip level contact portions extending along said first direction; and ends of said chip level contact portions being aligned along a line extending along said second direction, wherein the chip level contact portions of the multiplicity of leads having the board level contact portions disposed in vicinity to the third side are longer than the chip level contact portions of the multiplicity of leads having the board level contact portions disposed in vicinity to the fourth side.

16. The leadframe according to claim 15, wherein the line extending along said second direction is disposed closer to the fourth side than the third side.

* * * * *